United States Patent
Lien et al.

(10) Patent No.: US 10,707,139 B2
(45) Date of Patent: Jul. 7, 2020

(54) METHOD FOR ADJUSTING ETCHING PARAMETERS

(71) Applicant: Taiwan Semiconductor Manufacturing Co., Ltd., Hsinchu (TW)

(72) Inventors: Kuo-Sheng Lien, Hsinchu (TW); Shih-Ta Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 77 days.

(21) Appl. No.: 15/725,554

(22) Filed: Oct. 5, 2017

(65) Prior Publication Data
US 2018/0151454 A1    May 31, 2018

Related U.S. Application Data

(60) Provisional application No. 62/426,949, filed on Nov. 28, 2016.

(51) Int. Cl.
| | |
|---|---|
| *H01L 21/302* | (2006.01) |
| *H01L 21/66* | (2006.01) |
| *H01L 21/3213* | (2006.01) |
| *H01L 21/311* | (2006.01) |
| *H01L 21/3065* | (2006.01) |

(52) U.S. Cl.
CPC .......... *H01L 22/20* (2013.01); *H01L 21/3065* (2013.01); *H01L 21/31116* (2013.01); *H01L 21/32135* (2013.01); *H01L 21/32136* (2013.01); *H01L 21/32137* (2013.01); *H01L 22/12* (2013.01)

(58) Field of Classification Search
CPC ........... H01L 21/3065; H01L 21/31116; H01L 21/32135; H01L 21/32136; H01L 21/32137; H01L 22/20
USPC ......................................... 438/8, 9, 724, 735
See application file for complete search history.

(56) References Cited

U.S. PATENT DOCUMENTS

| | | | | |
|---|---|---|---|---|
| 2005/0085090 A1* | 4/2005 | Mui | ................... | H01L 21/02071 438/714 |
| 2012/0244458 A1* | 9/2012 | Luong | ................ | H01L 21/0337 430/5 |

* cited by examiner

*Primary Examiner* — Brook Kebede
(74) *Attorney, Agent, or Firm* — McClure, Qualey & Rodack, LLP

(57) ABSTRACT

An etching method for an IC is provided. The etching method includes retrieving processing data including a pattern-density and at least one etching parameter of an etching process for a semiconductor device; determining end point time by consulting a table which records historical information of a plurality of PDs, the etching parameter and the EP time; compensating for the PD and the EP time by adjusting the etching parameter to perform the etching process; and performing the etching process on another semiconductor device based on the adjusted etching parameter, the PD and the EP time to manufacture the IC.

20 Claims, 7 Drawing Sheets

METHOD FOR ADJUSTING ETCHING PARAMETERS

CROSS REFERENCE TO RELATED APPLICATIONS

This application claims the benefit of U.S. Provisional Application No. 62/426,949 filed on Nov. 28, 2016, the entirety of which is incorporated by reference herein.

BACKGROUND

Integrated circuits (ICs) have become increasingly important. Applications using ICs, such as cell phones, smartphones, tablets, laptops, notebook computers, PDAs, wireless email terminals, MP3 audio and video players, portable wireless web browsers and the like, are used by millions of people. Integrated circuits increasingly include powerful and efficient on-board data storage and logic circuitry for signal control and processing. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering the associated costs.

Various semiconductor processes have been used for manufacturing integrated circuits, and different pattern densities might be required for the semiconductor processes (especially the etching processes). Because the etching is affected by the pattern density, the various pattern densities of different semiconductor processes will result in a non-uniformity of the etching of the integrated circuits. Therefore, a method of adjusting etching parameters will be needed to compensate for the pattern density and reduce non-uniformity.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1A:
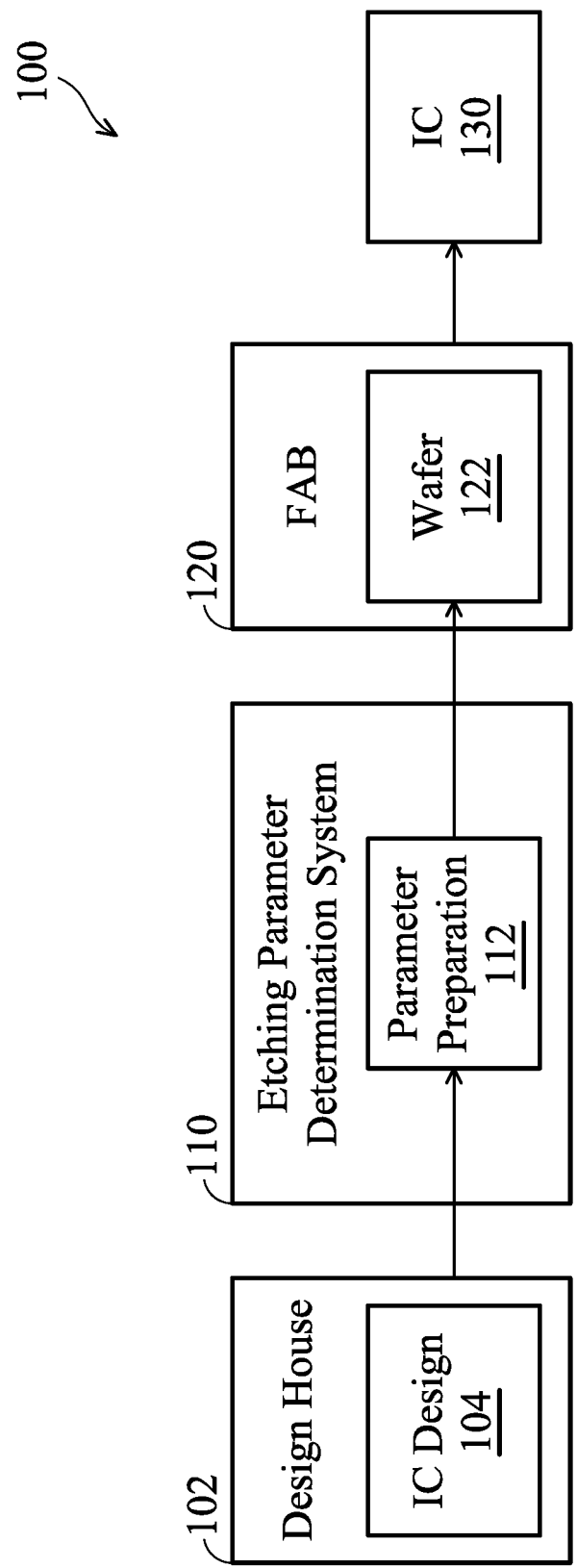
FIG. 1A is a simplified block diagram of an embodiment of an integrated circuit (IC) manufacturing system and an associated IC manufacturing flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

FIG. 1A is a simplified block diagram of an embodiment of an integrated circuit (IC) manufacturing system 100 and an associated IC manufacturing flow, which may benefit from various aspects of the present disclosure. The IC manufacturing system 100 includes a plurality of entities, such as a design house 102, an etching parameter determination system 110, and an IC manufacturer 120 (i.e., a fab), that interact with one another in the design, development, and manufacturing cycles and/or services related to manufacturing an integrated circuit (IC) 130. The IC 130 may include a plurality of semiconductor devices.

The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 102, etching parameter determination system 110, and IC manufacturer 120 may be owned by a single larger company, and may even coexist in a common facility and use common resources.

The design house (or design team) 102 generates an IC design 104. In some embodiments, the IC design 104 includes processing data which are used in semiconductor processes for manufacturing the IC 130. The processing data could include at least one design parameter and at least one etching parameter of an etching process of a thin film of a semiconductor device of the IC 130. For example, the design parameter could be pattern-density (PD)

The IC design 104 may further include various geometrical patterns designed for the IC 130. The geometrical patterns correspond to patterns of metal, oxide, or semiconductor layers that make up the various components of the IC 130 to be fabricated. The various layers combine to form various IC features. For example, a portion of the IC design 104 includes various IC features, such as active regions, gate electrodes, sources and drains, metal lines or vias of an interlayer interconnection, and openings for bonding pads, to be formed in a semiconductor substrate (such as a silicon wafer) and various material layers disposed on the semiconductor substrate. The design house 102 implements a proper design procedure to form the IC design 104. The design procedure may include logic design, physical design, and/or place and route.

The etching parameter determination system 110 includes a parameter preparation 112, and the parameter preparation 112 receives the IC design 104 from the design house 102 to generate processing parameters for manufacturing the semiconductor devices on the wafer 122. Specifically, the processing parameters may include an etching parameter, a pattern density (PD) and/or an end point (EP) time. The EP time is a period for etching the thin film of the semiconductor device. In one embodiment, the etching parameter includes flow rate of $O_2$, flow rate of $CHF_3$, flow rate of $Cl_2$, and/or temperature for etching the thin film.

The etching parameter determination system 110 is utilized to determine processing parameters including an etching parameter, a PD and/or an EP time. The determined processing parameters are transmitted to the FAB 120. Therefore, the etching process is performed on the wafer 122 in the FAB 120 according to the processing parameters which were determined by the etching parameter determination system 110.

The IC manufacturer 120, such as a semiconductor foundry, uses the processing parameters generated by the etching parameter determination system 110 to fabricate the IC 130. The IC manufacturer 120 is an IC fabrication business that can include a myriad of manufacturing facilities for the fabrication of a variety of different IC products. For example, there may be a first manufacturing facility for the front end fabrication of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business.

The FAB 120 further includes a plasma etching machine, a photo-resist coating machine and a spectrum machine. Specifically, in the plasma etching machine, the wafer 122 is positioned for treatment at a lower electrode in parallel to an upper electrode. A high frequency voltage is applied between the electrodes to generate plasma. In addition, the photo-resist coating machine is used to coat the photo resist on the substrate of the wafer 122. Then, the wafer 122 is etched adequately to a preset pattern corresponding to the photo resist.

According to such an etching method, to perform a precise etching process, a spectrum machine is utilized to accurately detect EP time when the etching process ends. For instance, a method using an emitted light spectroscope analysis has been widely utilized. According to such an end point detecting method, an actuated species is selected for easy observation, like a substance decomposed from an etching gas or a reaction product like ions, and the EP time is detected on the basis of changes in the emitted light intensity relevant to a preset wavelength.

In the present embodiment, a wafer 122 is fabricated using a mask to form the IC 130. The semiconductor wafer includes a silicon substrate or another proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The wafer 122 may further include various doped regions, dielectric features, and multilevel interconnects (formed at subsequent manufacturing steps).

Figure 1B:
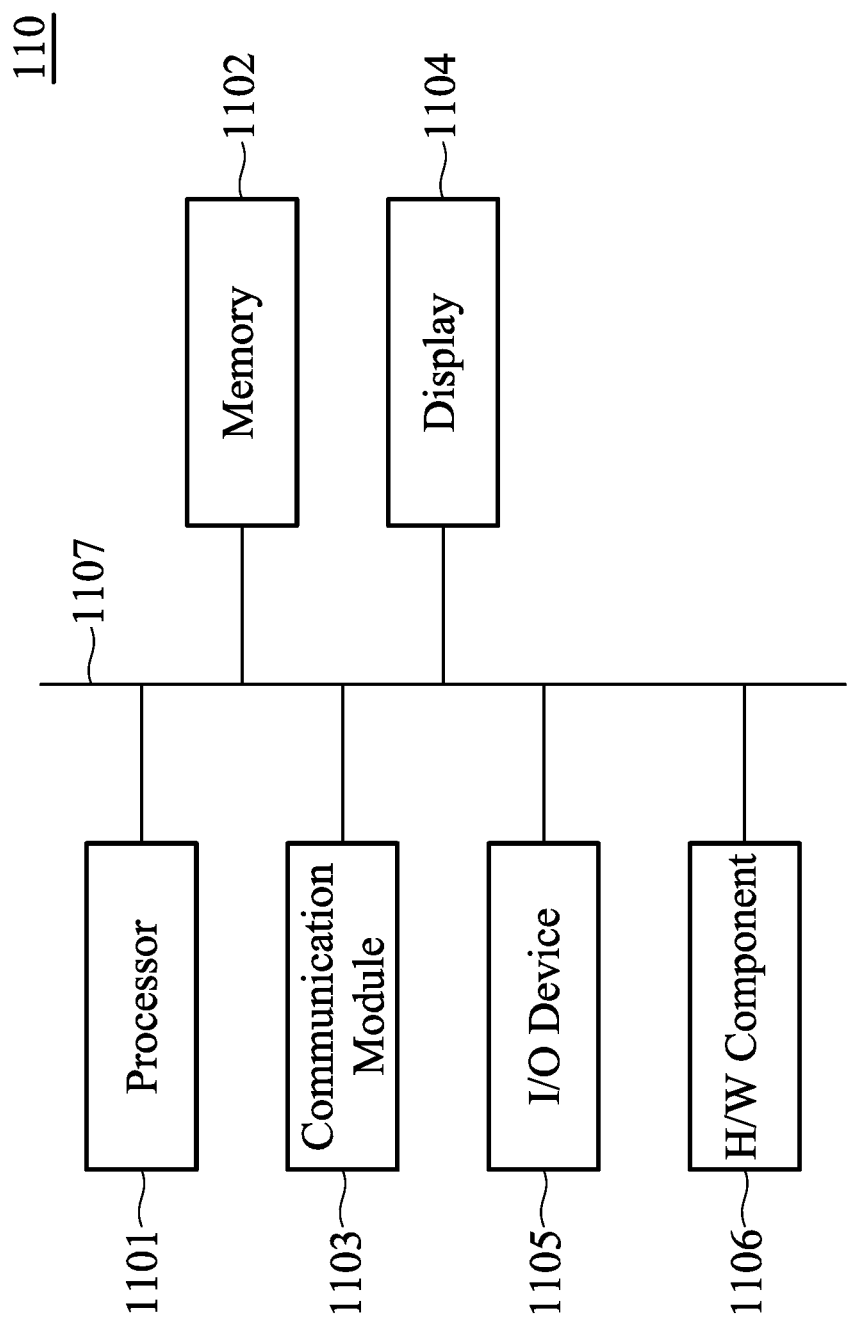
FIG. 1B is a more detailed block diagram of the etching system shown in FIG. 1 according to various aspects of the present disclosure.
Figure 5:
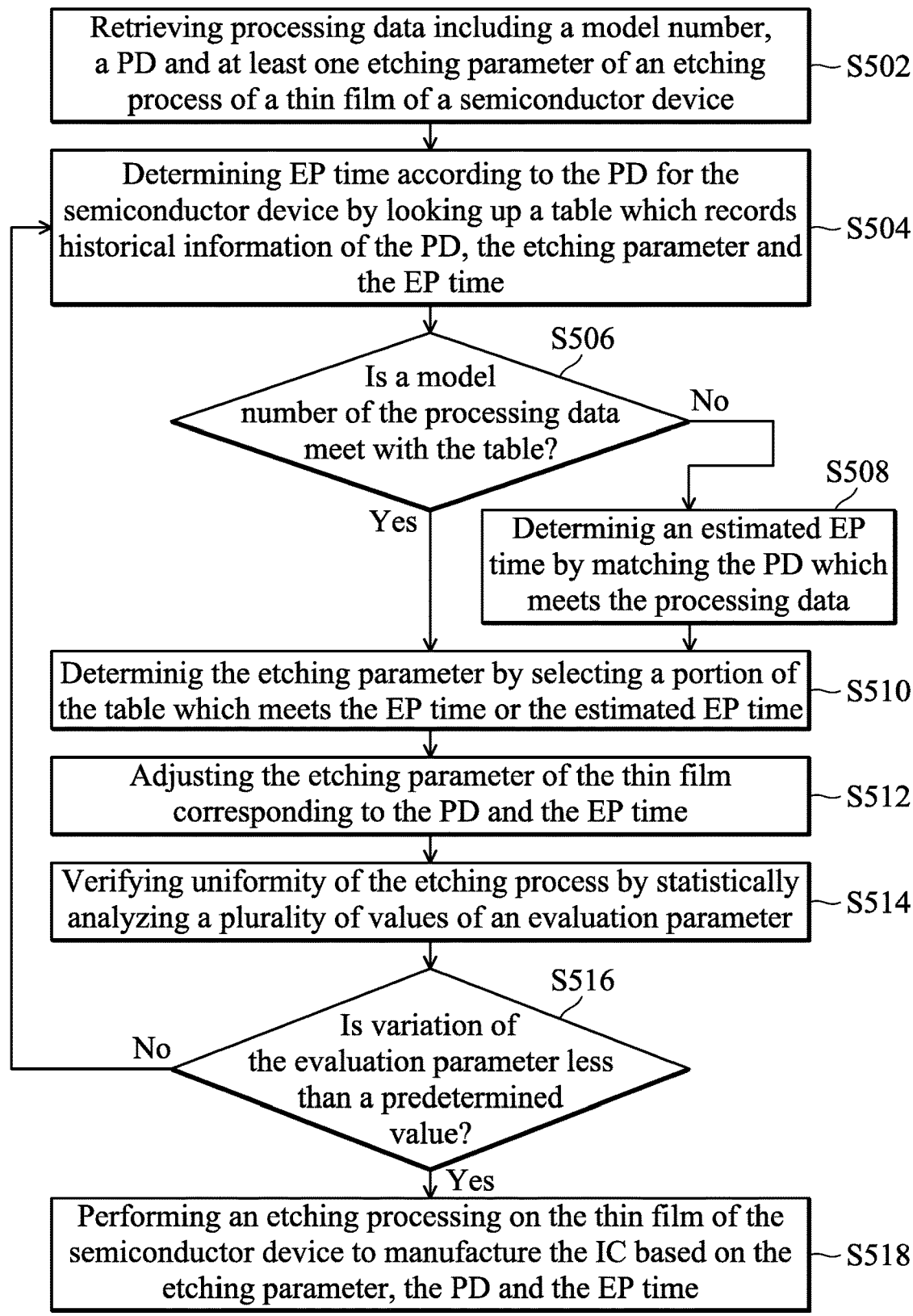
FIG. 5 is a flow chart of a method illustrating the etching method for fabricating an integrated circuit (IC), in accordance with some embodiments.
Figure 6:
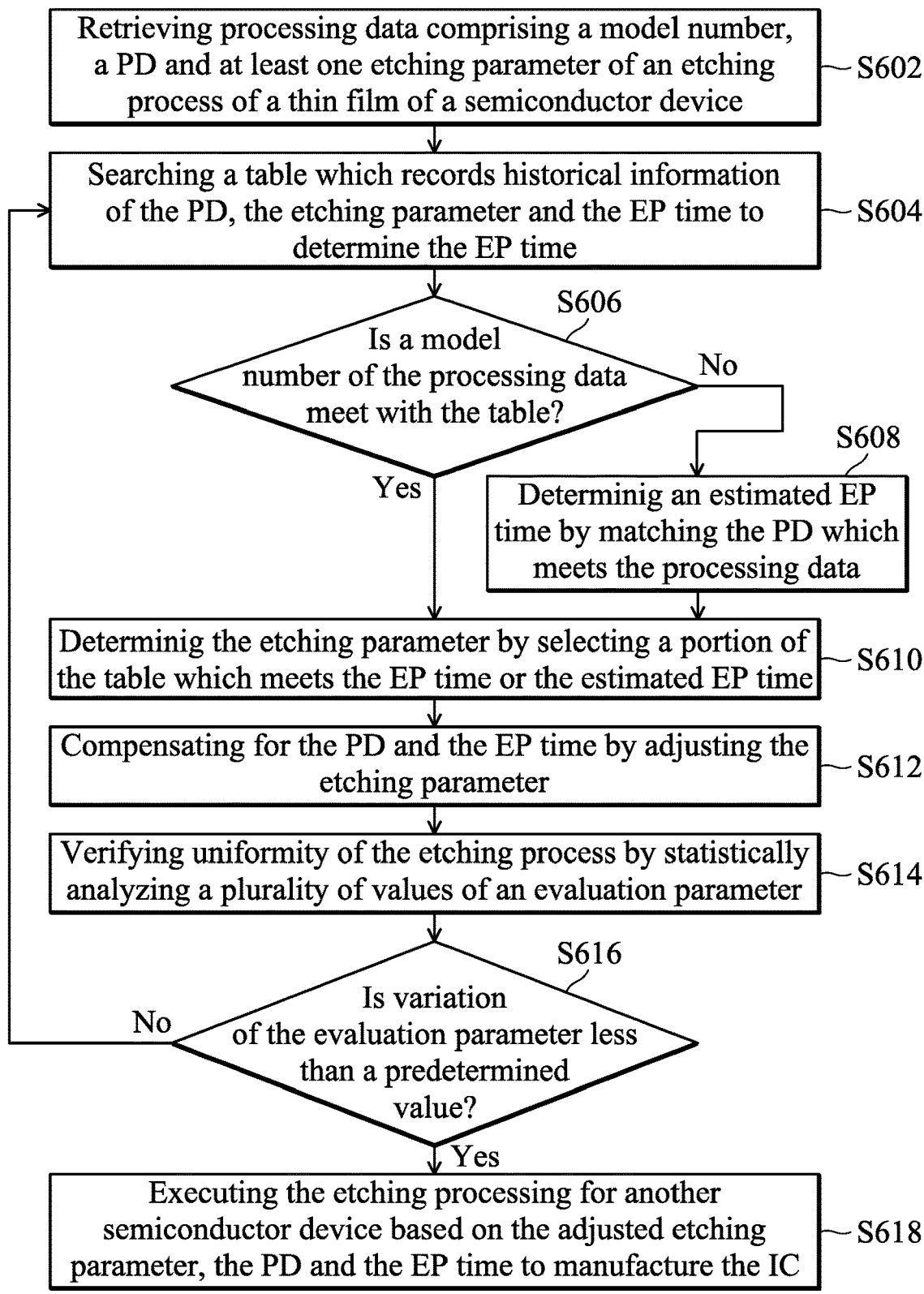
FIG. 6 is a flow chart of a method illustrating the etching method for fabricating an integrated circuit (IC), in accordance with some embodiments.

FIG. 1B is a more detailed block diagram of the etching parameter determination system 110 shown in FIG. 1A according to various aspects of the present disclosure. One or more of the tools and systems and operations described with respect to FIGS. 5-6 is realized in some embodiments by the etching parameter determination system 110 of FIG. 1B. The etching system 100 includes a processor 1101, a memory 1102, a communication module 1103, a display 1104, an input/output (I/O) device 1105, and one or more hardware components 1106 communicatively coupled via a bus 1107 or another interconnection communication mechanism.

The processor 1101 could include a digital signal processor (DSP), a microcontroller (MCU), a central-processing unit (CPU) or a plurality of parallel processors relating the parallel processing environment to implement the operating system (OS), firmware, driver and/or other applications of the etching parameter determination system 110.

The memory 1102 comprises, in some embodiments, a random access memory (RAM) or another dynamic storage device or read only memory (ROM) or other static storage devices, coupled to the bus 1107 for storing data and/or instructions to be executed by the processor 1101. The memory 1102 is also used, in some embodiments, for storing temporary variables or other intermediate information during the execution of instructions to be executed by the processor 1101.

The communication module 1103 is operable to communicate information such as IC design layout files with the other components in the IC manufacturing system 100, such as design house 102. Examples of communication modules may include Ethernet cards, 802.11 WiFi devices, cellular data radios, and/or other suitable devices known in the art.

The display 1104 is utilized to display the processing data and processing parameter the IC 130. The display 1104 can be a liquid-crystal panel or a touch display panel. The I/O device 1105 includes an input device, an output device and/or a combined input/output device for enabling user interaction with the etching parameter determination system 110. An input device comprises, for example, a keyboard, keypad, mouse, trackball, trackpad, and/or cursor direction keys for communicating information and commands to the processor 1101. An output device comprises, for example, a display, a printer, a voice synthesizer, etc. for communicating information to the user.

Figure 2A:
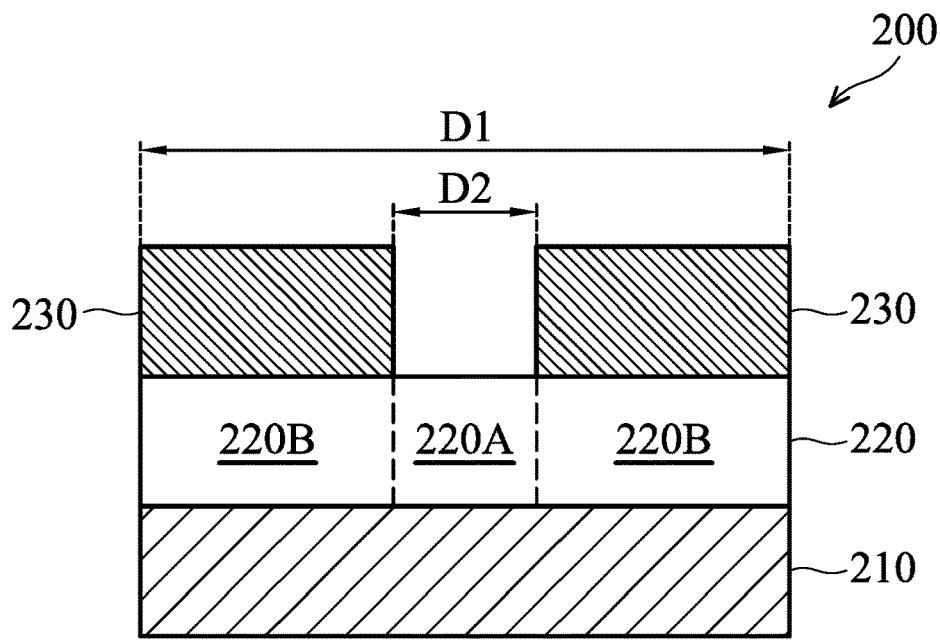
FIG. 2A is a schematic diagram of a semiconductor device with a pattern density, in accordance with some embodiments.

FIG. 2A is a schematic diagram of a semiconductor device 200 with a pattern density, in accordance with some embodiments. The semiconductor device 200 includes a substrate 210, a thin film 220 and a photo-resist layer 230. The thin film 220 is on the substrate 210, and the photo-resist layer 230 is on the thin film to execute an etching process. The substrate 210 is a bulk semiconductor substrate, such as a semiconductor wafer. For example, the substrate 210 is a silicon wafer, which may include silicon or another elementary semiconductor material such as germanium. In other embodiments, the substrate 210 includes a compound semiconductor. The compound semiconductor may include gallium arsenide, silicon carbide, indium arsenide, indium phosphide, another suitable material, or a combination thereof.

In some embodiments, the thin film 220 could be polysilicon. In other embodiments, the thin film 220 could be silicon-nitride, such as $Si_3N_4$. In addition, the thin film 220 could be metal, such as Au, Al, Cu or AlCu. The photo-resist layer 230 is a light-sensitive material used in several industrial processes, such as etching, to form a pattern.

As shown in FIG. 2A, the thin film 220 could be divided into region 220A and at least one region 220B. The region 220B is covered by the photo-resist layer 230, and the region 220A is not covered by the photo-resist layer 230. Accordingly, the region 220A will be etched since it is not covered by the photo-resist layer 230. The region 220B will not be etched and remain after the etching process because it is covered by the photo-resist layer 230.

In the embodiment of FIG. 2A, the length of the region 220A is D2, and the length of the thin film 220 is D1. As such, the PD could be defined by the ratio between D2 and D1. Specifically, the PD is determined by dividing D2 with D1. The PD increases as the length of the region 220A increases. In other words, a high PD means that a small portion of the thin film 220 will be etched, and a low PD means that a large portion of the thin film will be etched.

Figure 2B:
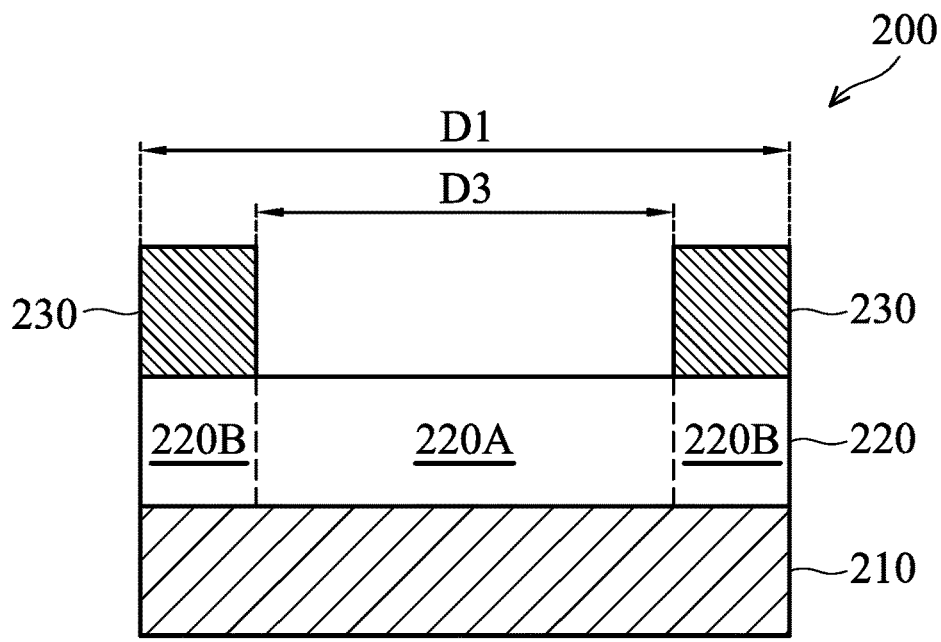
FIG. 2B is a schematic diagram of another semiconductor device with a pattern density, in accordance with some embodiments.

FIG. 2B is a schematic diagram of another semiconductor device 200 with a pattern density, in accordance with some embodiments. The semiconductor device 200 includes a substrate 210, a thin film 220 and a photo-resist layer 230. The thin film 220 is on the substrate 210, and the photo-resist layer 230 is on the thin film to execute an etching process. The thin film 220 could be divided into region 220A and regions 220B. The region 220B is covered by the photo-resist layer 230, and the region 220A is not covered by the photo-resist layer 230. The length of the region 220A is D3, and the length of the thin film 220 is D1. Therefore, the PD could be defined by the ratio between D3 and D1.

Because the length D3 is greater than the length D2, the PD of FIG. 2B is greater than the PD of FIG. 2A. Compared to the embodiment of FIG. 2A, the semiconductor device 200 of FIG. 2B requires more time for etching. The period of time for etching the region 220A of the thin film 220 could be defined as the end point (EP) time.

Specifically, whether the etching is finished or not could be determined by detecting the spectrum of the thin film 220 with the plasma. The plasma is utilized to hit the thin film 220 and the substrate 210. When the etching is not finished, the plasma will hit the thin film 220 and will be reflected off it. When the etching is finished, the plasma will hit the substrate and will be reflected off it, since the thin film 220 is etched and does not exist. The spectrum of the plasma reflected by the thin film 220 and the spectrum of the plasma reflected by the substrate 210 are different. Therefore, the EP time could be determined by detecting the spectrum of the plasma.

Figure 2C:
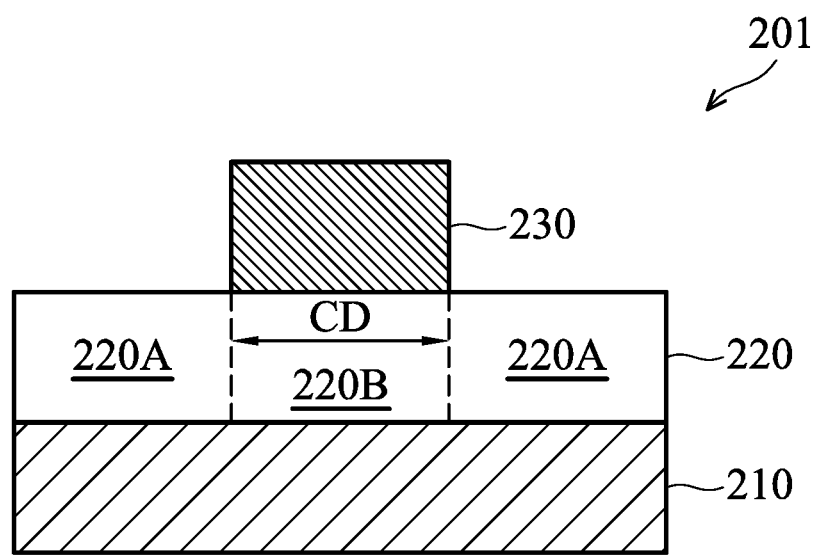
FIG. 2C is a schematic diagram of another semiconductor device illustrating a critical dimension, in accordance with some embodiments.

FIG. 2C is a schematic diagram of another semiconductor device 201 illustrating a critical dimension (CD), in accordance with some embodiments. The semiconductor device 201 is a testing pattern or a testing device. Specifically, the semiconductor device 201 is arranged in a specified and fixed position of the wafer 122 in order to perform the validation and evaluation of the IC 130. In other words, the testing device is utilized to detect whether the IC 130 was properly manufactured and functions precisely.

The semiconductor device 201 includes a substrate 210, a thin film 220 and a photo-resist layer 230. The thin film 220 is on the substrate 210, and the photo-resist layer 230 is on the thin film to execute an etching process. The thin film 220 could be divided into region 220A and region 220B. The region 220B is covered by the photo-resist layer 230, and the region 220A is not covered by the photo-resist layer 230. After the etching process is performed, the region 220B remains. The length of region 220B of the thin film 220 is defined as the CD.

Figure 3:
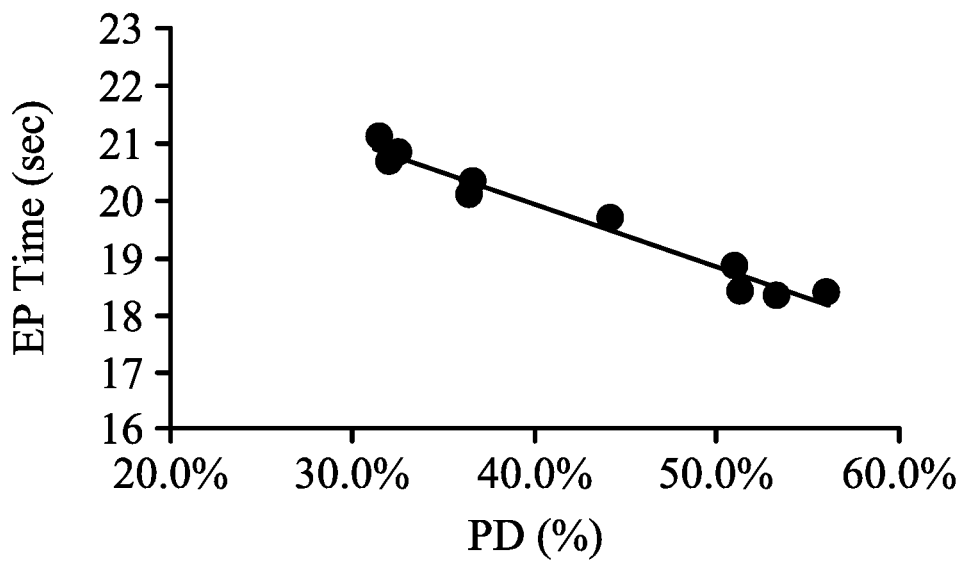
FIG. 3 is a schematic diagram illustrating the end-point time and the pattern density, in accordance with some embodiments.

FIG. 3 is a schematic diagram illustrating the end-point time and the pattern density, in accordance with some embodiments. As shown in FIG. 3, the EP time corresponding to 30% of PD is about 21 sec, and the EP time corresponding to 50% of PD is about 19 sec. The EP time is inversely proportional to the PD. Therefore, the EP time could be determined according to the PD. It should be noted that the relationship between the EP time and the PD could be changed according to the material and the manufacturing process of the semiconductor device 200.

In some embodiments, a table is developed which records historical information of the PD, the model number, the etching parameter, the evaluation parameter and the EP time. The historical information is derived by previous lots of the etching process. The table is provided below. It should be noted that the values in the table are used for illustration, not for limiting the present disclosure.

TABLE 1

| Model Number | PD (%) | EP Time (sec) | Etching Parameter | Evaluation Parameter |
|---|---|---|---|---|
| A01 | 70 | 30 | 12 | 0.282 |
| A02 | 68.7 | 31 | 11.8 | 0.281 |
| A03 | 67.3 | 32 | 11.6 | 0.283 |
| A04 | 66 | 33 | 11.4 | 0.283 |
| A05 | 64.7 | 34 | 11.2 | 0.282 |
| A06 | 63.3 | 35 | 11 | 0.281 |
| A07 | 62 | 36 | 10.8 | 0.28 |
| A08 | 60.7 | 37 | 10.6 | 0.282 |
| A09 | 59.3 | 38 | 10.4 | 0.282 |
| A10 | 58 | 39 | 10.2 | 0.281 |
| A11 | 56.7 | 40 | 10 | 0.284 |
| A12 | 55.3 | 41 | 9.8 | 0.28 |
| A13 | 54 | 42 | 9.6 | 0.279 |
| A14 | 52.7 | 43 | 9.4 | 0.281 |
| A15 | 51.3 | 44 | 9.2 | 0.28 |
| A16 | 50 | 45 | 9 | 0.281 |

TABLE 1-continued

| Model Number | PD (%) | EP Time (sec) | Etching Parameter | Evaluation Parameter |
|---|---|---|---|---|
| A17 | 48.7 | 46 | 8.8 | 0.285 |
| A18 | 47.3 | 47 | 8.6 | 0.283 |
| A19 | 46 | 48 | 8.4 | 0.28 |
| A20 | 44.7 | 49 | 8.2 | 0.279 |
| A21 | 43.3 | 50 | 8 | 0.28 |
| A22 | 42 | 51 | 7.8 | 0.282 |
| A23 | 40.7 | 52 | 7.6 | 0.281 |
| A24 | 39.3 | 53 | 7.4 | 0.28 |
| A25 | 38 | 54 | 7.2 | 0.282 |
| A26 | 36.7 | 55 | 7 | 0.279 |
| A27 | 35.3 | 56 | 6.8 | 0.285 |
| A28 | 34 | 57 | 6.6 | 0.280 |
| A29 | 32.7 | 58 | 6.4 | 0.282 |
| A30 | 31.3 | 59 | 6.2 | 0.28 |
| A31 | 30 | 60 | 6 | 0.281 |

Regarding each model number, four corresponding values for the PD, the EP time, the etching parameter and the evaluation parameter are included. Each model number associated with the four values is utilized to represent a manufacturing condition of the semiconductor device 200 of the IC 130. For example, in model A01, the PD is 70%, the EP time is 30 sec, the etching parameter is 12, and the evaluation parameter is 0.282. Regarding model A02, the PD is 68.7%, the EP time is 31 sec, the etching parameter is 11.8, and the evaluation parameter is 0.281. The method of determining the PD and the EP time has been illustrated before, and will not be repeated again.

In some embodiments, the etching parameter includes flow rate of $O_2$, flow rate of $CHF_3$, flow rate of $Cl_2$, or temperature for etching the thin film 220. The evaluation parameter includes CD of the thin film 220 or the electrical characteristics of the semiconductor device 200 after the etching process. The electrical characteristics could be the relationship between the current and voltage of the semiconductor device 200, or the relationship between the capacitance and voltage of the semiconductor device 200.

As shown in Table 1, The EP time is inversely proportional to the PD. When the PD of the semiconductor device 200 is low, it means that it needs longer time for etching compared to a high PD. It should be noted that the etching which is enhanced by a certain type of gas could happen in the vertical direction and the horizontal direction. When the etching process is long, the CD might be decreased due to the effect of the horizontal etching. Therefore, the CD of a low PD could be lower than that of a high PD because of the longer duration of the etching process. In other words, the etching process will be affected by the PD, and the uniformity will deteriorate accordingly.

In some embodiments, the etching parameters could be adjusted to compensate for the PD and improve the uniformity of the semiconductor devices 200. The etching parameters include flow rate of $O_2$, flow rate of $CHF_3$, flow rate of $Cl_2$, or temperature for etching the thin film 220. The etching parameters are determined according to material of the thin film 220 to execute the etching process.

In some embodiments, the thin film 220 is poly-silicon, and the etching parameter is the flow rate of $O_2$ or the temperature which are proportional to the PD. The flow rate of $O_2$ and the temperature are positive contributions to the etching process, which means that flow rate of $O_2$ and the temperature are utilized to enhance or accelerate the etching process. When the PD is high and EP time is low, the flow rate of $O_2$ or the temperature will be increased to enhance the etching process. When the PD is low and EP time is high, the flow rate of $O_2$ or the temperature will be decreased to suppress the etching process. By adjusting the flow rate of $O_2$ or the temperature, the etching of the thin film 220 could be unified regardless of variations in the PD.

As shown in Table 1, the etching parameter (such as flow rate of $O_2$) is proportional to PD and makes positive contributions to the etching process. Regarding model A01, the PD is 70%, the EP time is 30 sec, the etching parameter is 12 sccm, and the evaluation parameter (such as the CD) is 0.282 um. Regarding model A31, the PD is 30%, the EP time is 60 sec, the etching parameter is 6 sccm, and the evaluation parameter is 0.281, which is approximately the same as the evaluation parameter of model A01. Therefore, by adjusting the etching parameter, the variation of the evaluation parameter which is caused by the PD could be decreased and eliminated. Consistent evaluation parameters can be obtained no matter how the PD might change. In other words, an accurate and reliable etching process can be controlled to remove the effect of the PD.

In other embodiments, the thin film 220 is metal or compound metal, and the etching parameter is the flow rate of $Cl_2$ or the temperature which are proportional to the PD. The flow rate of $Cl_2$ and the temperature are positive contributions to the etching process, which means that the flow rate of $Cl_2$ and the temperature are utilized to enhance or accelerate the etching process. When the PD is high and EP time is low, the flow rate of $Cl_2$ or the temperature will be increased to enhance the etching process. When the PD is low and EP time is high, the flow rate of $O_2$ or the temperature will be decreased to suppress the etching process. By adjusting the flow rate of $Cl_2$ or the temperature, the etching of the thin film 220 could be unified regardless of variations in the PD.

In other embodiments, the thin film 220 is silicon-nitride, and the etching parameter is the flow rate of $O_2$ or the flow rate of $CHF_3$, the flow rate of $O_2$ is proportional to the PD, and the flow rate of $CHF_3$ is inversely proportional to the PD. The flow rate of $O_2$ is a positive contribution to the etching process, which means that the flow rate of $O_2$ is utilized to enhance or accelerate the etching process. When the PD is high and EP time is low, the flow rate of $O_2$ will be increased to enhance the etching process. When the PD is low and EP time is high, the flow rate of $O_2$ will be decreased to suppress the etching process.

Furthermore, the flow rate of $CHF_3$ is a negative contribution to the etching process, which means that flow rate of $CHF_3$ is utilized to suppress and restrain the etching process. When the PD is high and EP time is low, the flow rate of $CHF_3$ will be decreased to restrain the etching process. When the PD is low and EP time is high, the flow rate of $CHF_3$ will be increased to enhance the etching process. By adjusting the flow rate of $CHF_3$ or $O_2$, the etching of the thin film 220 could be unified regardless of variations in the PD.

Figure 4:
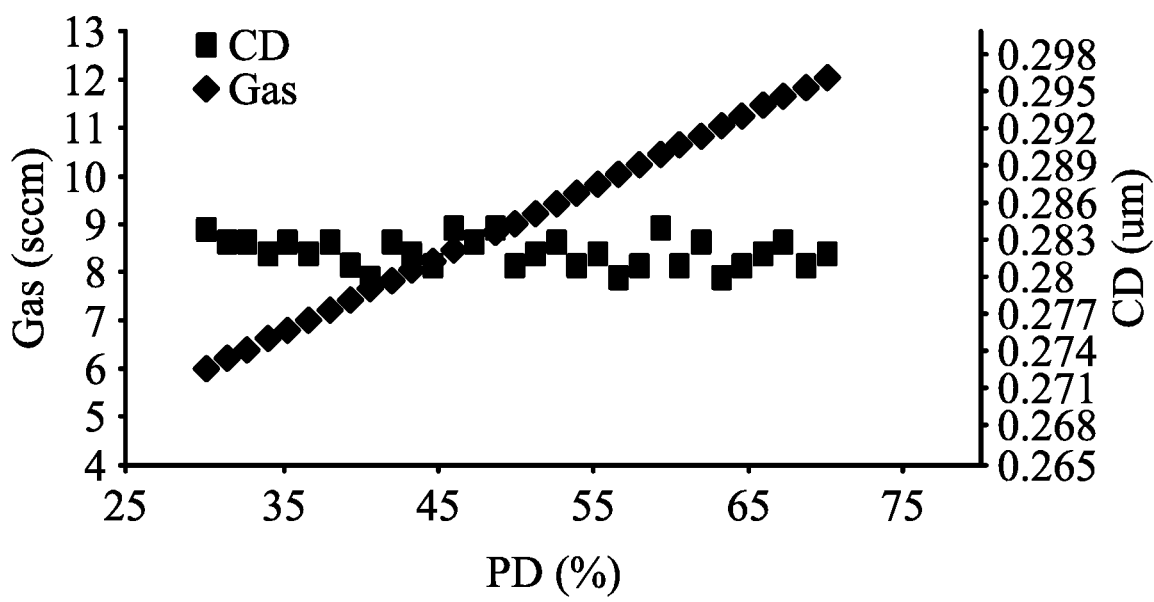
FIG. 4 is a schematic diagram illustrating the end-point time, the adjusting parameter, and the pattern density, in accordance with some embodiments.

FIG. 4 is a schematic diagram illustrating the evaluation parameter, the adjusting parameter, the evaluation parameter and the pattern density, in accordance with some embodiments. In some embodiments, the evaluation parameter could be the flow rate of various kinds of gas including $CHF_3$, $Cl_2$, or $O_2$. The evaluation parameter could be the CD to evaluate the diversity of a plurality of semiconductor devices 200. As shown in FIG. 4, 30 semiconductor devices 200 with different PDs are illustrated. Regarding the semiconductor device 200 with a PD of 70%, its corresponding etching parameter is 12 sccm, and the CD is 0.282 um. Regarding the semiconductor device 200 with a PD of 30%, its corresponding etching parameter is 6 sccm, and its corresponding CD is 0.281, which is approximately the same as the evaluation parameter when the PD is 70%.

As such, by adjusting the etching parameter, the variation of the evaluation parameter which is caused by the PD could be decreased and eliminated. In other words, an accurate and reliable etching process can be controlled to remove the effect of the PD. Therefore, consistent evaluation parameters can be obtained regardless of diversity and variations in the PD.

In some embodiments, the uniformity of the etching process is verified by statistically analyzing a plurality of values of an evaluation parameter. Specifically, the uniformity of the etching process is verified when a variation of the evaluation parameter is less than a predetermined value. Afterwards, the verified etching process is executed for another semiconductor device based on the etching parameter, the PD and the EP time. The predetermined value could be one sigma, which could be calculated from a plurality of values of the evaluation parameter by a statistical analysis method. The predetermined value illustrated above is used for illustration, not for limiting the present disclosure.

In the embodiments of FIG. 4, the values of the CD of the 30 semiconductor devices 200 are from 0.279 um to 0.285 um. By analyzing the CD values with statistical methods, the variation of the CD values could be calculated to evaluate the uniformity of the CD values.

When the variation of the CD values is less than a sigma, it means that the etching process is verified. The etching parameter, the PD and the EP time of the etching process could be recorded in the Table and be used to manufacture another semiconductor device 200 which belongs to another wafer of the next lot. One lot could include many wafers for manufacturing ICs with a group of semiconductor manufacturing parameters. When the variation of the CD values is not less than a sigma, it means that the etching process is not verified. The etching parameter should be adjusted again to compensate for the PD and the EP time until it is verified by calculating the variation of the CD values.

FIG. 5 is a flow chart of a method 500 illustrating the etching method for fabricating an IC, in accordance with some embodiments. The method 500 may be implemented, in whole or in part, by the etching parameter determination system 110 and the FAB 120. It should be understood that additional operations can be provided before, during, and after the method 500, and some operations described can be replaced, eliminated, or moved around for additional embodiments of the method. The method 500 is an example, and is not intended to limit the present disclosure beyond what is explicitly recited in the claims. The method 500 includes operations S502 to S518. These operations are discussed further below.

In operation S502, processing data is retrieved by the etching parameter determination system 110, and the processing data includes a model number, a PD and at least one etching parameter of an etching process of a thin film 220 of a semiconductor device 200. In operation S504, EP time is determined according to the PD for the semiconductor device 200 by looking up a table. As shown in Table 1, the table records historical information of the PD, the etching parameter and the EP time.

In operation S506, whether or not a model number of the processing data matches or meets with the table is determined. When the model number of the processing data does not meet with the table, operation S508 will be executed to determine an estimated EP time by matching the PD which meets the processing data. It should be noted that the estimated EP time might be different from the EP time of operation S504.

When the model number of the processing data matches or meets with the table, operation S510 will be executed. In operation S510, the etching parameter is determined by selecting a portion of the table which meets the EP time or the estimated EP time. It should be noted that the EP time of operation S504 is utilized for an etching process when the model number of the processing data matches or meets with the table. In addition, the estimated EP time of operation S508 is utilized for the etching process when the model number of the processing data does not meet with the table.

In the embodiment of Table 1, the model numbers A01~A31 are included in association with their corresponding PD, EP time, etching parameter and evaluation parameter. Whether or not a model number of the processing data meets with the table is determined based on the model numbers A01~A31. When the model number of the processing data belongs to any one of the model numbers A01~A31, it is determined that the processing data meets with the table. The etching parameter could further be determined by the matched model number.

When the model number of the processing data does not belong to any one of the model numbers A01~A31, it is determined that the processing data does not meet with the table. Afterwards, the EP time will be determined by matching the PD which meets the processing data. For example, the processing data with model number A50 and 67% of PD is not met with the table, since the model number A50 does not belong to any one of the model numbers A01~A31. However, among the model numbers A01~A31, the PD (67.3%) of model number A03 is closest to the PD (67%) of model number A50. Therefore, model number A03 of the table will be selected to determine an EP time of 32 sec. In addition, the corresponding etching parameter (11.6) of model number A03 will also be used for adjusting the etching manufacturing process.

In the embodiment of the method 500, in operation S512, the etching parameter of the thin film 220 corresponding to the PD and the EP time is adjusted. In operation S514, uniformity of the etching process is verified by statistically analyzing a plurality of values of an evaluation parameter. In operation S516, whether or not a variation of the evaluation parameter is less than a predetermined value is determined. For example, the predetermined value could be one sigma.

Specifically, when the evaluation parameter is not less than a predetermined value, S504 will be executed again to determine the EP time again according to the PD for the semiconductor device 200. When the evaluation parameter is less than a predetermined value, operation S518 will be executed. In operation S518, an etching process is performed on the thin film 220 of the semiconductor device 200 in the FAB 120 to manufacture the IC 130 based on the etching parameter from the etching parameter determination system 110, the PD and the EP time.

In some embodiments, the method 500 does not include operations S514 and S516. In other words, operation S518 of performing the etching process on the thin film 220 will be executed after operation S512 without executing the operations S514 and S516.

FIG. 6 is a flow chart of a method 600 illustrating the etching method for fabricating an IC, in accordance with some embodiments. The method 600 may be implemented, in whole or in part, by the etching parameter determination system 110 and the FAB 120. It should be understood that additional operations can be provided before, during, and after the method 600, and some operations described can be replaced, eliminated, or moved around for additional embodiments of the method. The method 600 is an example, and is not intended to limit the present disclosure beyond what is explicitly recited in the claims. The method 600 includes operations S602 to S618. These operations are further discussed below.

In operation S602, processing data is retrieved by the etching parameter determination system 110, and the processing data includes a model number, a PD and at least one etching parameter of an etching process of a thin film 220 of a semiconductor device 200. In operation S604, a table is searched to determine the EP time according to the PD for the semiconductor device 200. As shown in Table 1, the table records historical information of the PD, the etching parameter and the EP time.

In operation S606, whether or not a model number of the processing data meets with the table is determined. When the model number of the processing data does not meet with the table, operation S608 will be executed to determine the EP time by matching the PD which meets the processing data. When the model number of the processing data meets with the table, operation S610 will be executed. It should be noted that the EP time determined in the operation S608 is an estimated EP time, which is different from the EP time of operation S604.

In operation S610, the etching parameter is determined by selecting a portion of the table which meets the EP time or the estimated EP time. The EP time of operation S604 is utilized for etching process when the model number of the processing data meets with the table. In addition, the estimated EP time of operation S608 is utilized for the etching process when the model number of the processing data does not meet with the table.

In the embodiment of the method 600, in operation S612, the PD and the EP time are compensated by adjusting the etching parameter. In operation S614, uniformity of the etching process is verified by statistically analyzing a plurality of values of an evaluation parameter. In operation S616, whether or not a variation of the evaluation parameter is less than a predetermined value is determined. For example, the predetermined value could one sigma.

Specifically, when the evaluation parameter is not less than a predetermined value, S604 will be executed again to determine the EP time again according to the PD for the semiconductor device 200. When the evaluation parameter is less than a predetermined value, operation S618 will be executed. In operation S618, the etching process is performed on another semiconductor device based on the adjusted etching parameter, the PD and the EP time to manufacture the IC 130.

In some embodiments, the method 600 does not include the operations S614 and S616. In other words, operation S618 of performing the etching process on the thin film 220 will be executed after operation S612 without executing the operations S614 and S616.

In some embodiments, one or more of the operations and/or functions of the tools and/or systems described with respect to FIGS. 1-6 is/are implemented by specially configured hardware (e.g., by one or more application-specific integrated circuits or ASIC(s)) which is/are included) separate from or in lieu of the processor 610. Some embodiments incorporate more than one of the described operations and/or functions in a single ASIC.

In some embodiments, the operations and/or functions are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By utilizing the proposed etching method of the present disclosure, the etching parameter is adjusted to decrease the variation of the evaluation parameter which is caused by the PD. Consistent evaluation parameters can be obtained no matter how the PD might change. In other words, an accurate and reliable etching process can be controlled to remove the effects of the PD. Therefore, the etching method of adjusting etching parameters can be utilized to compensate for the pattern density and reduce non-uniformity.

In accordance with some embodiments, an etching method for fabricating an integrated circuit is provided. The etching method includes retrieving processing data comprising a pattern-density and at least one etching parameter of an etching process of a thin film of a semiconductor device; determining end point time according to the PD for the semiconductor device which is a period for etching the thin film of the semiconductor device; and adjusting the etching parameter of the thin film corresponding to the PD and the EP time; and performing the etching process on the thin film of the semiconductor device to manufacture the IC based on the etching parameter, the PD and the EP time.

In accordance with some embodiments, an etching method for fabricating an integrated circuit is provided. The etching method includes retrieving processing data comprising a pattern-density and at least one etching parameter of an etching process for a semiconductor device; determining end point time by consulting a table which records historical information of a plurality of PDs, the etching parameter and the EP time which is a period to perform the etching process on a thin film of the semiconductor device, and the historical information are derived by previous lots of the etching process; compensating for the PD and the EP time by adjusting the etching parameter to perform the etching process; and performing the etching process on another semiconductor device based on the adjusted etching parameter, the PD and the EP time to manufacture the IC.

In accordance with some embodiments, a non-transitory computer-readable medium containing instructions which, when executed by a processor of a computer system, cause the processor to execute an etching method for fabricating an integrated circuit. The etching method includes retrieving processing data comprising a pattern-density and at least one etching parameter of an etching process of a thin film of a semiconductor device; determining end point time according to the PD for the semiconductor device which is a period for etching the thin film of the semiconductor device; and adjusting the etching parameter of the semiconductor device to compensate for the PD and the EP time; and performing an etching process on the thin film of the semiconductor device for the next lot to manufacture the IC based on the adjusted etching parameter, the PD and the EP time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An etching method for fabricating an integrated circuit (IC), comprising:
   retrieving processing data comprising a pattern-density (PD) and at least one etching parameter of an etching process of a thin film of a semiconductor device;
   determining end point (EP) time according to the PD for the semiconductor device, wherein the EP time is a period for etching the thin film of the semiconductor device; and
   adjusting the etching parameter of the thin film corresponding to the PD and the EP time; and
   performing the etching process on the thin film of the semiconductor device to manufacture the IC based on the etching parameter, the PD and the EP time.

2. The etching method as claimed in claim 1, further comprising verifying uniformity of the etching process by statistically analyzing a plurality of values of an evaluation parameter.

3. The etching method as claimed in claim 2, wherein the evaluation parameter comprises critical dimension (CD) of the thin film after the etching process.

4. The etching method as claimed in claim 2, wherein the uniformity of the etching process is verified when variation of the values of the evaluation parameter is less than a predetermined value, and the verified etching process is executed for another semiconductor device based on the etching parameter, the PD and the EP time.

5. The etching method as claimed in claim 1, wherein the etching parameter comprises flow rate of O2, flow rate of CHF3, flow rate of Cl2, or temperature for etching the thin film.

6. The etching method as claimed in claim 5, wherein the thin film is poly-silicon, and the etching parameter is the flow rate of O2 or the temperature which are proportional to the PD.

7. The etching method as claimed in claim 5, wherein the thin film is silicon-nitride, and the etching parameter is the flow rate of O2 or the flow rate of CHF3, the flow rate of O2 is proportional to the PD, and the flow rate of CHF3 is inversely proportional to the PD.

8. The etching method as claimed in claim 5, wherein the thin film is metal, and the etching parameter is the flow rate of Cl2 or the temperature which are proportional to the PD.

9. The etching method as claimed in claim 1, wherein the EP time is determined by consulting a table which records historical information of the PD, the etching parameter and the EP time, wherein the historical information are derived by previous lots of the etching process.

10. The etching method as claimed in claim 9, wherein when a model number of processing data is met with the table, the etching parameter is determined by selecting a portion of the table which meets the processing data.

11. The etching method as claimed in claim 9, wherein when a model number of processing data is not met with the table, an estimated EP time is determined by matching the PD which meets the processing data, and the etching parameter is determined by selecting a portion of the table which meets the estimated EP time.

12. An etching method for fabricating an integrated circuit (IC), comprising:
   retrieving processing data comprising a pattern-density (PD) and at least one etching parameter of an etching process for a semiconductor device;
   determining end point (EP) time by searching a table which records historical information of a plurality of PDs, the etching parameter and the EP time, wherein the EP time is a period to perform the etching process on a thin film of the semiconductor device, and the historical information are derived by previous lots of the etching process;
   compensating for the PD and the EP time by adjusting the etching parameter to perform the etching process; and
   executing the etching process for another semiconductor device based on the adjusted etching parameter, the PD and the EP time to manufacture the IC.

13. The etching method as claimed in claim 12, wherein when a model number of processing data is met with the table, the etching parameter is determined by selecting a portion of the table which meets the processing data.

14. The etching method as claimed in claim 12, wherein when a model number of processing data is not met with the table, an estimated EP time is determined by matching the PD which meets the processing data, and the etching parameter is determined by selecting a portion of the table which meets the estimated EP time.

15. The etching method as claimed in claim 12, wherein the etching parameter comprises flow rate of O2, flow rate of CHF3, flow rate of Cl2, or temperature for etching the thin film.

16. The etching method as claimed in claim 15, wherein the thin film is poly-silicon, and the etching parameter is the flow rate of O2 or the temperature which are proportional to the PD.

17. The etching method as claimed in claim 15, wherein the thin film is silicon-nitride, and the etching parameter is the flow rate of O2 or the flow rate of CHF3, the flow rate of O2 is proportional to the PD, and the flow rate of CHF3 is inversely proportional to the PD.

18. The etching method as claimed in claim 15, wherein the thin film is metal, and the etching parameter is the flow rate of Cl2 or the temperature which are proportional to the PD.

19. An etching method for fabricating an integrated circuit (IC), comprising:
   obtaining processing data comprising a pattern-density (PD) and at least one etching parameter of an etching process for a semiconductor device to determine an end point (EP) time by evaluating the PD for the semiconductor device, wherein the EP time is a period to perform the etching process on a thin film of the semiconductor device;
   compensating for the PD and the EP time by adjusting the etching parameter to perform the etching process;
   executing the etching process for another semiconductor device based on the adjusted etching parameter, the PD and the EP time to manufacture the IC; and
   verifying uniformity of the etching process by statistically analyzing a plurality of values of an evaluation parameter.

20. The etching method as claimed in claim 19, wherein the evaluation parameter comprises critical dimension (CD) of the thin film after the etching process, the uniformity of the etching process is verified when variation of the values of the evaluation parameter is less than a predetermined value, and the verified etching process is executed for another semiconductor device based on the etching parameter, the PD and the EP time.

* * * * *